United States Patent
Shirai

Patent Number: 5,992,031
Date of Patent: Nov. 30, 1999

[54] HANDGRIP SUPPORTING MECHANISM FOR ELECTRIC DEVICES

[75] Inventor: Masami Shirai, Tokyo, Japan

[73] Assignee: Asahi Kogaku Kogyo Kabushiki Kaisha, Tokyo, Japan

[21] Appl. No.: 08/886,568

[22] Filed: Jul. 1, 1997

[30] Foreign Application Priority Data

May 7, 1996 [JP] Japan .................................. 8-195672

[51] Int. Cl.[6] .............................. B25G 3/00; G01C 3/00
[52] U.S. Cl. ........................ 33/290; 16/114 R; 16/116 R; 16/112; 33/704
[58] Field of Search .............................. 33/290, 291, 292, 33/703, 704; 16/114 R, 112, 116 R

[56] References Cited

U.S. PATENT DOCUMENTS

| | | | |
|---|---|---|---|
| 2,416,621 | 2/1947 | Gretschel | 16/114 R |
| 2,537,750 | 1/1951 | Gretschel | 16/114 R |
| 4,827,567 | 5/1989 | Beach | 16/114 R |
| 5,005,255 | 4/1991 | Pare et al. | 16/112 R |
| 5,159,760 | 11/1992 | Spiegel et al. | 33/292 |

FOREIGN PATENT DOCUMENTS 2140367  11/1990  Japan .

Primary Examiner—Christopher W. Fulton
Attorney, Agent, or Firm—Greenblum & Bernstein, P.L.C.

[57] ABSTRACT

A handgrip mounting structure in an electric device comprises a main body and a handgrip to be mounted on the main body. The handgrip includes a holding portion, to be held by an operator, having a predetermined length, and mounting portions to be mounted on the main body. The mounting portions are provided at each end of the holding portion. The handgrip has a thermal expansion ratio in the longitudinal direction of the holding portion that is different from that of the main body. At least one of the mounting portions of the holding portion is mounted to the main body so that a shaft member, provided on one of the mounting portions and the main body, is inserted into a through hole formed on the other of the main body and the one of the mounting portions. A clearance in the longitudinal direction of the holding portion is provided between the through hole and the shaft member so that a dimensional change, due to thermal expansion, between the holding portion and the main body is permitted by relative movement between the holding portion and the main body.

26 Claims, 9 Drawing Sheets

HANDGRIP SUPPORTING MECHANISM FOR ELECTRIC DEVICES

BACKGROUND OF THE INVENTION

1. Field of the invention

The present invention relates to a handgrip supporting mechanism for an electric apparatus, such as a surveying device.

2. Description of the Related Art

As surveying devices for measuring the azimuth, vertical and horizontal angles of an object point, a theodolite and a transit have been widely used as angle measuring devices.

In this type of surveying device, a pointing telescope for aiming at an object point is provided in such a manner that the pointing telescope is horizontally and vertically rotatable about horizontal and vertical axes. The surveying device is provided with a horizontal and vertical rotation angle detecting means (such as encoders) to detect an angle of rotation of the pointing telescope about the horizontal and vertical axes, respectively. According to the detected rotational angles, an azimuth angle of an object point is surveyed.

Recently, a device called a total station which is the combination of an electro-optical distance meter and an electronic theodolite has been practically used. The electro-optical distance meter is arranged to measure a distance to an object point with a round-trip light travelling time.

In this type of surveying device, what is obtained at first hand is rotational angle information of the pointing telescope. It is therefore necessary to detect an attitude of the surveying device itself.

Because of this requirement to obtain attitude information, the surveying device has been equipped with, for example, a two-axis automatic inclination correction sensor. It should be understood that detected information from such a sensor may directly influence the precision of the surveyed results. Accordingly, a sensor such as a two-axis automatic inclination correction sensor is mounted to the surveying device with high precision.

Also, for the purpose of carrying the surveying device, a handgrip is mounted at the upper part of the device.

The handgrip comprises a handle with a predetermined length, and a pair of mounting portions which are respectively extended from each end of the handle to the body of the surveying device. The mounting portions are detachably attached to the body with screws.

However, as surveying devices in general comprise various members made of different materials, and a handgrip is usually made of a material different from that of the surveying device, due to the differences in the thermal expansion ratios of the material of the handgrip and that of the surveying device, there may be a dimensional discrepancy in the extending direction of the handgrip and the surveying device when an ambient temperature changes.

As a result, when distortion might occur due to the force caused by the differences of thermal expansion ratios, the inclination detecting sensor changes the attitude, and an error may possibly occur.

Also, there may be a case where a handgrip is unnecessary when the surveying device is being operated. In such a case the handgrip is removed from the surveying device and then reattached. In this case, if the handgrip is removed in an environment where the ambient temperature is −20° C., then reattached after the surveying device has been carried to a new environment where the ambient temperature is 30° C., the resulting differences in thermal expansion ratios will cause a force to be applied to the handgrip and the surveying device, and will cause possible error.

Conventionally, the location of the inclination detecting sensor is carefully selected so that the inclination detecting sensor is not influenced by this distortion, but efforts to provide a better location of the inclination detecting sensor have so far been unsuccessful. Also, as the location of the inclination detection sensor is. limited, there is less freedom in design-work.

The present invention was created in order to solve these kinds of drawbacks which have been experienced in the conventional surveying devices.

SUMMARY OF THE INVENTION

The object of the present invention is to eliminate the adverse effects on the handgrip and the surveying device due to temperature changes.

To attain the object of the present invention, there is provided a handgrip mounting structure in an electric device. The electric device comprises a main body and a handgrip to be mounted on the main body. The handgrip includes a holding portion, to be held by an operator, having a predetermined length, and mounting portions to be mounted on the main body. The mounting portions are provided at each end of the holding portion, and the handgrip has a thermal expansion ratio in the longitudinal direction of the holding portion that is different from that of the main body. At least one of the mounting portions of the holding portion is mounted to the main body in such a manner that a shaft member provided on one of the mounting portion and the main body is inserted into a through hole formed on the other of the main body and the mounting portion. A clearance in the longitudinal direction of the holding portion is provided between the through hole and the shaft member so that a dimensional change due to thermal expansion between the holding portion and the main body is allowed through relative movement of the holding portion and the main body, which is allowed through the clearance.

The disclosure relates to the subject matter contained in Japanese patent application No. 8-195672 (filed on Jul. 5, 1996).

BRIEF DESCRIPTION OF THE DRAWINGS

The invention will be described below in detail with reference to the accompanying drawings, in which.

DESCRIPTION OF THE PREFERRED EMBODIMENTS

The embodiments of the present invention will be explained with reference to the accompanying drawings.

Figure 9:
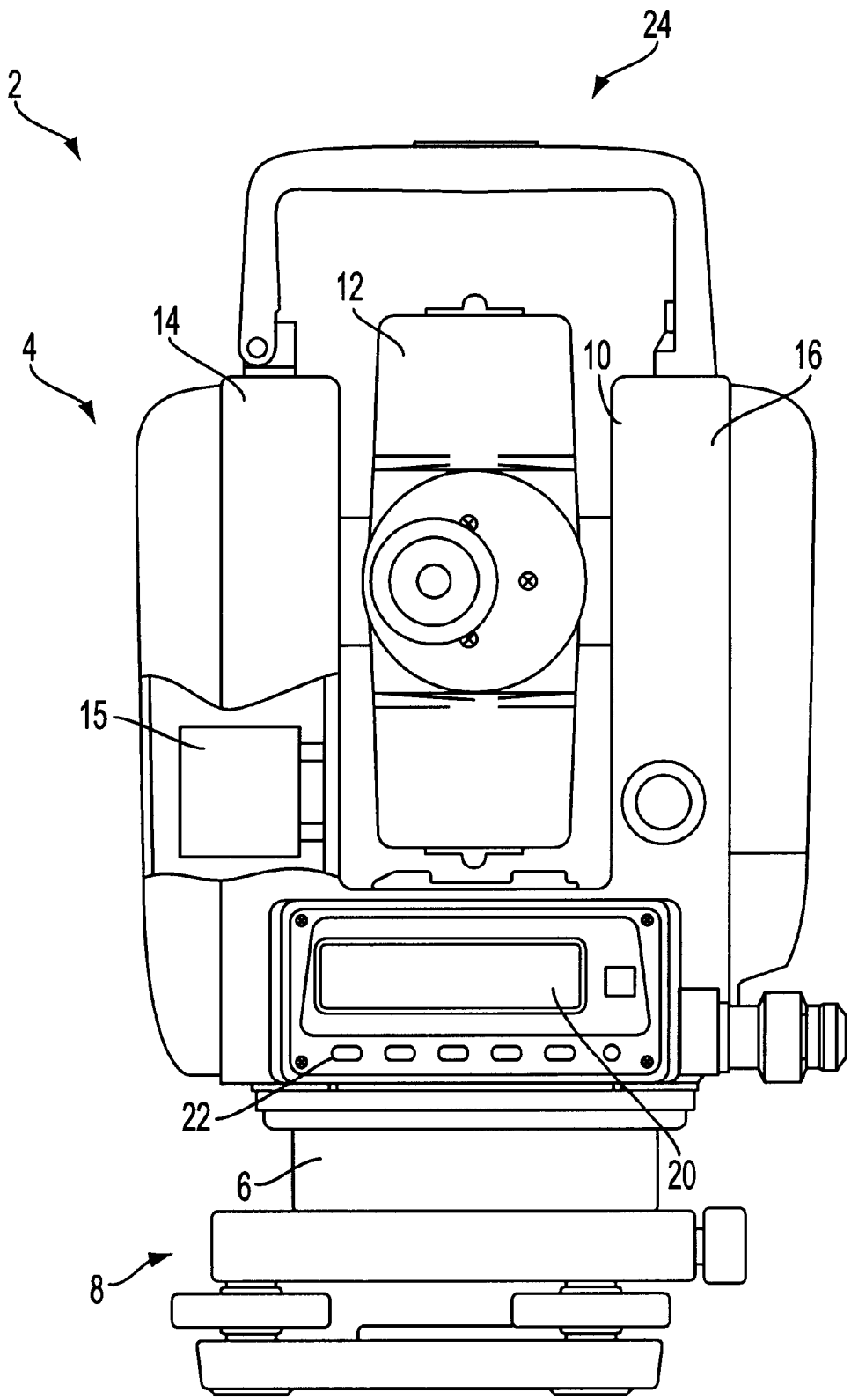
FIG. 9 is a front view of the surveying device in FIG. 1 with the handgrip attached.
Figure 10:
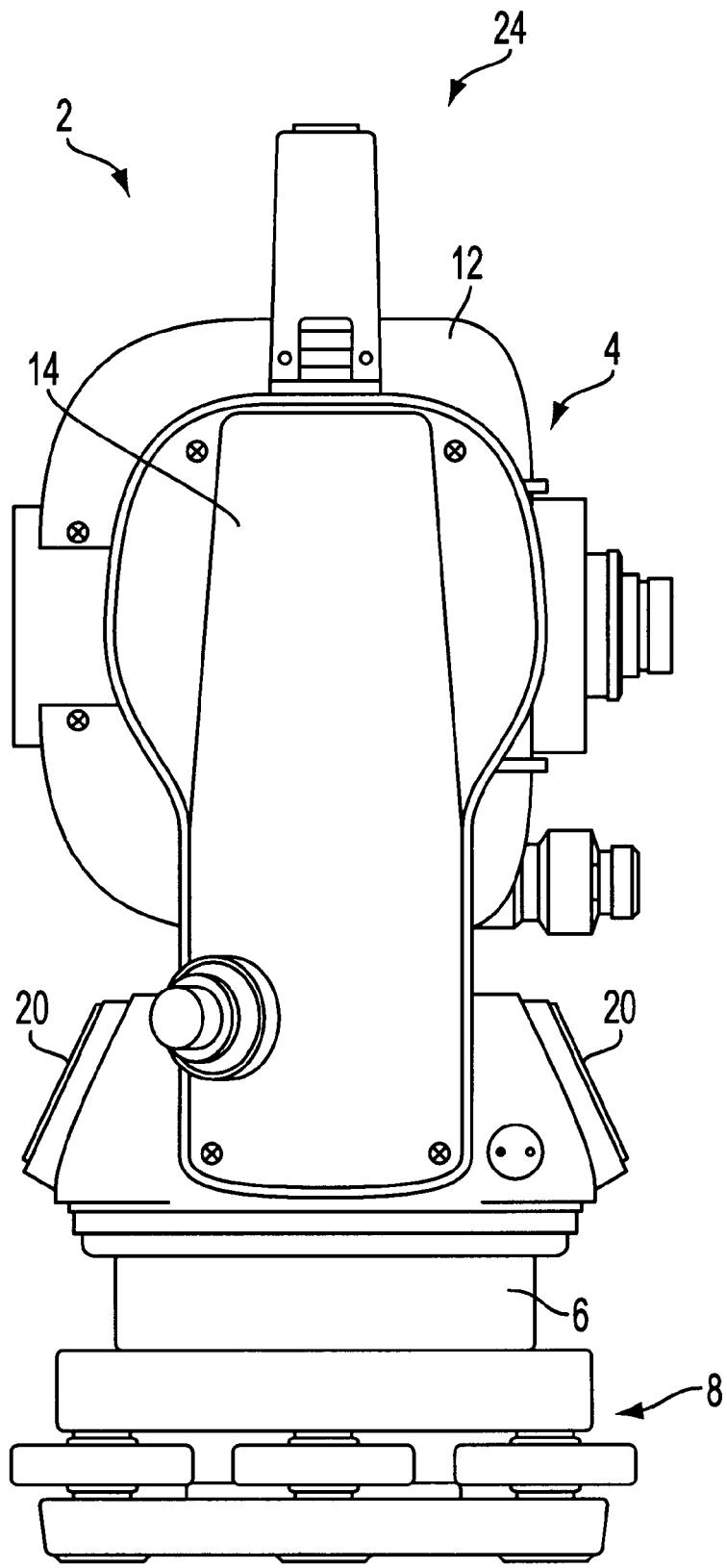
FIG. 10 is a side view of the surveying instrument in FIG. 1 with the handgrip attached.

Referring to FIGS. 9 and 10, the mounting structure of the handgrip to the electronic surveying device will be explained.

The surveying device 2 comprises a main unit 4, a base 6, and a leveling block 8, in this order viewed downward from the top of the drawing.

The main unit 4 is substantially U-shaped, and the U-shaped portion 10 houses a pointing telescope 12.

The main unit 4 comprises two upright portions, 14 and 16, and a 2-axis auto inclination correction sensor 15 is positioned on the upright portion 14.

On the front and back side of main unit 4, there is provided a display 20 which displays the results of surveying operations, and a data input section 22 which the input of necessary operational data and operational commands.

A handgrip 24 is mounted at the apex portions of upright portions 14 and 16.

Referring to FIGS. 1 through 4, the mounting structure of the handgrip 24 will be explained in detail.

The handgrip 24 comprises an extended holding portion 25 and legs 26, 26 which extend at both ends of the holding portion 25. At the ends of both legs 26, mounting portions 28 and 30 are formed.

Figures 1, 2:
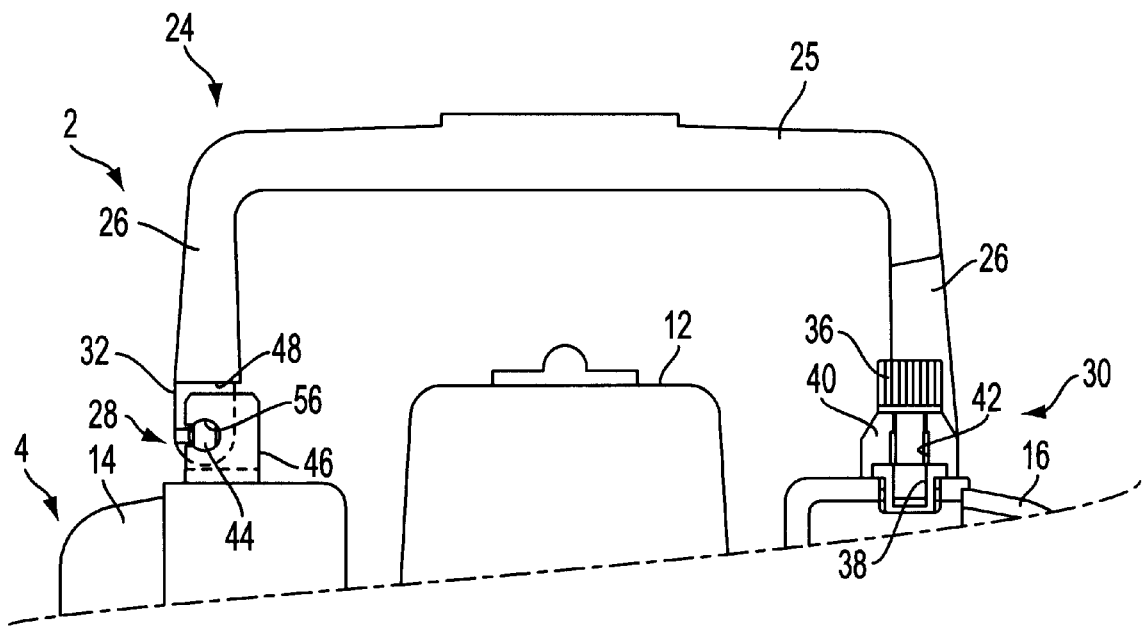
FIG. 1 is an illustration of a first embodiment of the present invention, showing a partial sectional view of the mounting structure of the handgrip.
FIG. 2 is a partial side sectional view of the embodiment of FIG. 1.

The shape of the handgrip 24, as seen in FIG. 1, is like a cross-section of a channel member. As shown in FIG. 1, the holding portion 25 horizontally extends, and each leg portion 26, which is integrally formed with the holding portion 25, vertically extends from each end of the holding portion 25. At each end of the vertically extended leg portion 26, as explained above, there is provided the mounting portions 28 and 30, respectively.

The mounting portion 30 is arranged to be detachably attached to the upright portion 16 through a male screw 36 and a female screw 38 formed in the upright portion 16.

On the mounting portion 30, a boss portion 40 is formed which has an upper surface substantially parallel with the extending direction of the holding portion 25. In the boss portion 40, a through hole 42 is formed.

The male screw 36 is provided with a head portion rotatable with the operator's fingers. The boss portion 40 is fixed at the apex portion of the upright portion 16 by screw-engaging the male screw 36 with the female screw 38, while the male screw 36 is being inserted in the through hole 42.

The other mounting portion 28 is detachably attached to the apex portion of upright portion 14 using a pin 44 (a shaft member of the present invention) and a holder 46.

On the mounting portion 28, there is provided a bifurcated portion 32, and a bottom space 48 is formed between each of the bifurcated portions 32.

On each of the bifurcated portions 32, a through hole 52 is formed parallel with the extending direction of the holding portion 25, with both through holes 52 being substantially aligned.

Figure 3A:
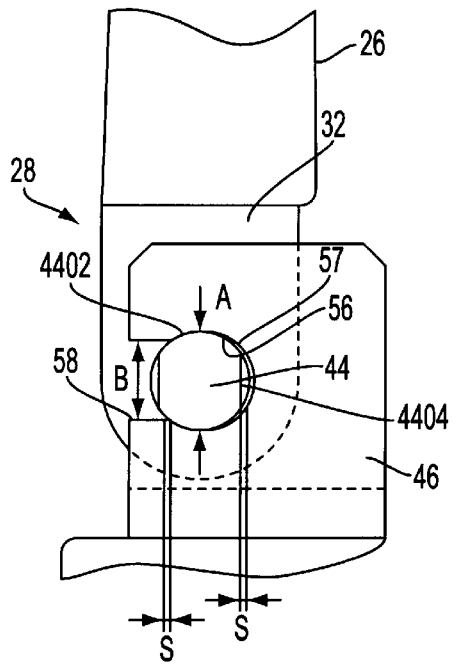
FIGS. 3A and 3B are partial enlarged front views of the mounting structure of the handgrip.
Figure 3B:
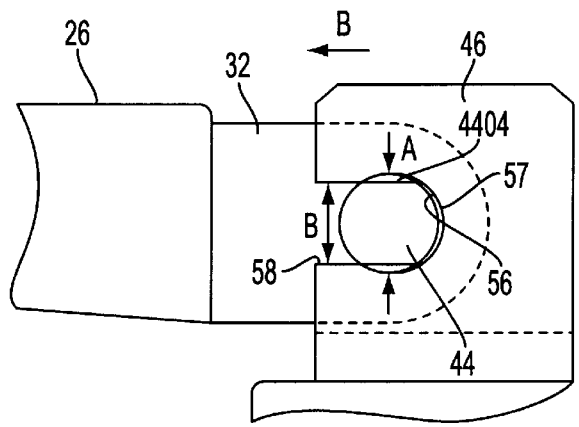

The cross-section of the pin 44, as shown in FIGS. 3A and 3B, is formed in a shape, which is cut away at both circular ends. Accordingly, the cross-section of the pin 44 comprises circular arc portions 4402 and flat portions 4404. The width between the circular arc portions 4402 are longer than that of the flat portions 4404. In other words, in this embodiment, the circular arc portions 4402 are formed as a wider width portion, and the flat portions 4404 are formed as a narrower width portion.

The pin 44 is inserted into the through holes 52, and fixed at the bifurcated portions 32 with a screw 54 so that the flat portions 4404 are parallel with the extending direction of the leg portions 26.

The holder 46 is fixed on the apex of the upright portion 14 by a screw 4602. The holder 46 is so fixed as to face side surfaces toward the left and right directions of the surveying device 2 as shown in FIG. 2.

At the center of the holder 46 in the vertical direction, a through hole 56, which extends in the front-to-back direction of the surveying device 2 (a through hole of the present invention), is formed.

The through hole 56 comprises a flattened groove 57 which extends in the direction of the holding portion 25, and an open leading portion 58. It should be understood that the opening (vertical) width of the open leading portion 58 is formed shorter than the vertical width of the flattened groove 57 (FIG. 3(A)).

In detail, as exaggeratedly drawn in FIG. 3 (C), the flattened groove 57 is formed by a pair of flat portions 57A, which extend parallel with the holding portion 25, and a pair of circular portions 57B each of which is smoothly connected with the ends of the flat portions. On one of the pair of the circular portions, the open leading portion 58 is formed.

As shown in FIG. 3A, the vertical width A of the flattened groove 57 (the length between the flat portions) are formed slightly larger than the diameter of the circular arc portion 4402 of the pin 44 so that the pin 44 can rotate in the flattened groove 57. On the other hand, as shown in FIG. 3B, the vertical width B of the open leading portion 58 is formed to be greater than the distance between the flat portions 4404, so that the pin 44 can move in the open leading portion 58 under the condition that the flat portions 4404 are respectively facing upwardly and downwardly in the vertical direction of the surveying device 2.

Figure 3C:
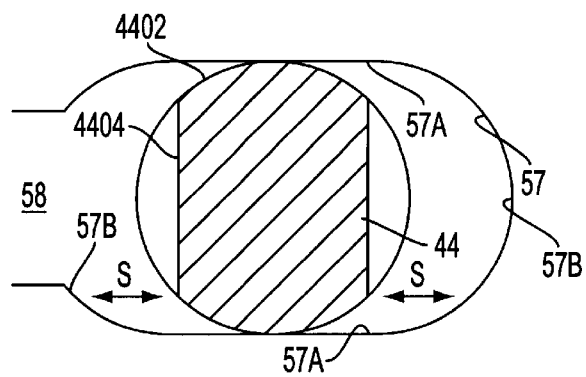
FIG. 3C is an enlarged and exaggerated view of the elongated hole portion for the purpose of clarity.

Furthermore, as shown in FIGS. 3A and 3C, with the pin 44 being positioned in the flattened groove 57, and the leg portions 26 being normal to the ground, a clearance S is formed between the flat portion 4404 and an inner periphery of the flattened groove 57. As shown in FIG. 3C, the clearances S are formed on both sides of the flat portions 4404. One clearance S is formed between the flat portion 4404 and an inner periphery of the flattened groove 57, the other clearance S is formed between the flat portion 4404 and an inner periphery of the flattened groove 57, in the vicinity of the open leading portion 58.

The mounting portion 28 is connected to the holder 46 by inserting the pin 44 into the through hole 56 formed in the holder 46 while the holder 46 is positioned in the bottomed space 48 formed between the bifurcated portions 32.

When a very large zenith angle is surveyed with the surveying instrument 2, there may be a case where it is necessary to remove the holding portion 25. This can be achieved by loosening the male screw 36, then removing the mounting portion 30 from the apex portion of the upright portion 16.

Figure 4:
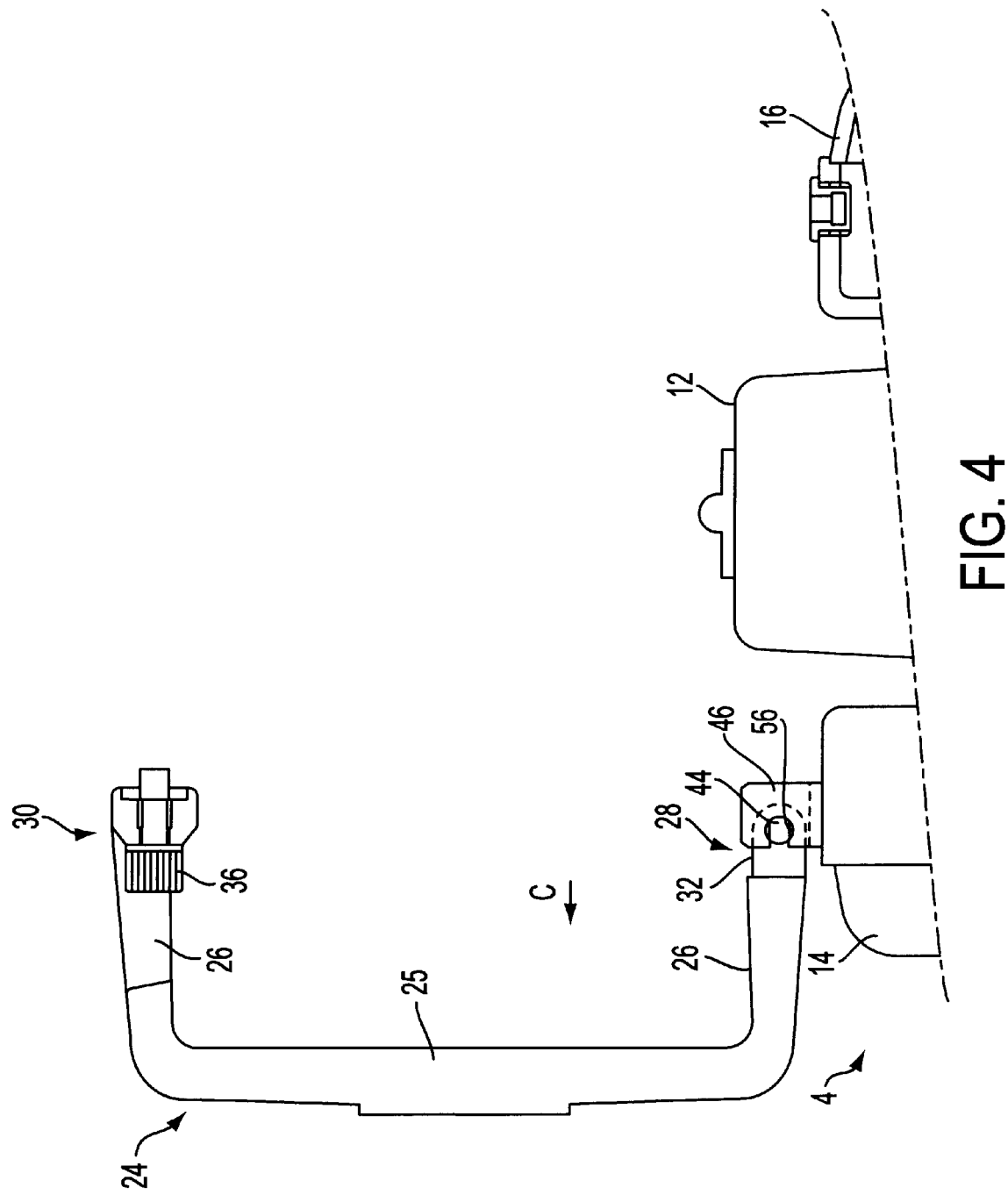
FIG. 4 is a partial sectional view of the handgrip being removed.
Figure 5:
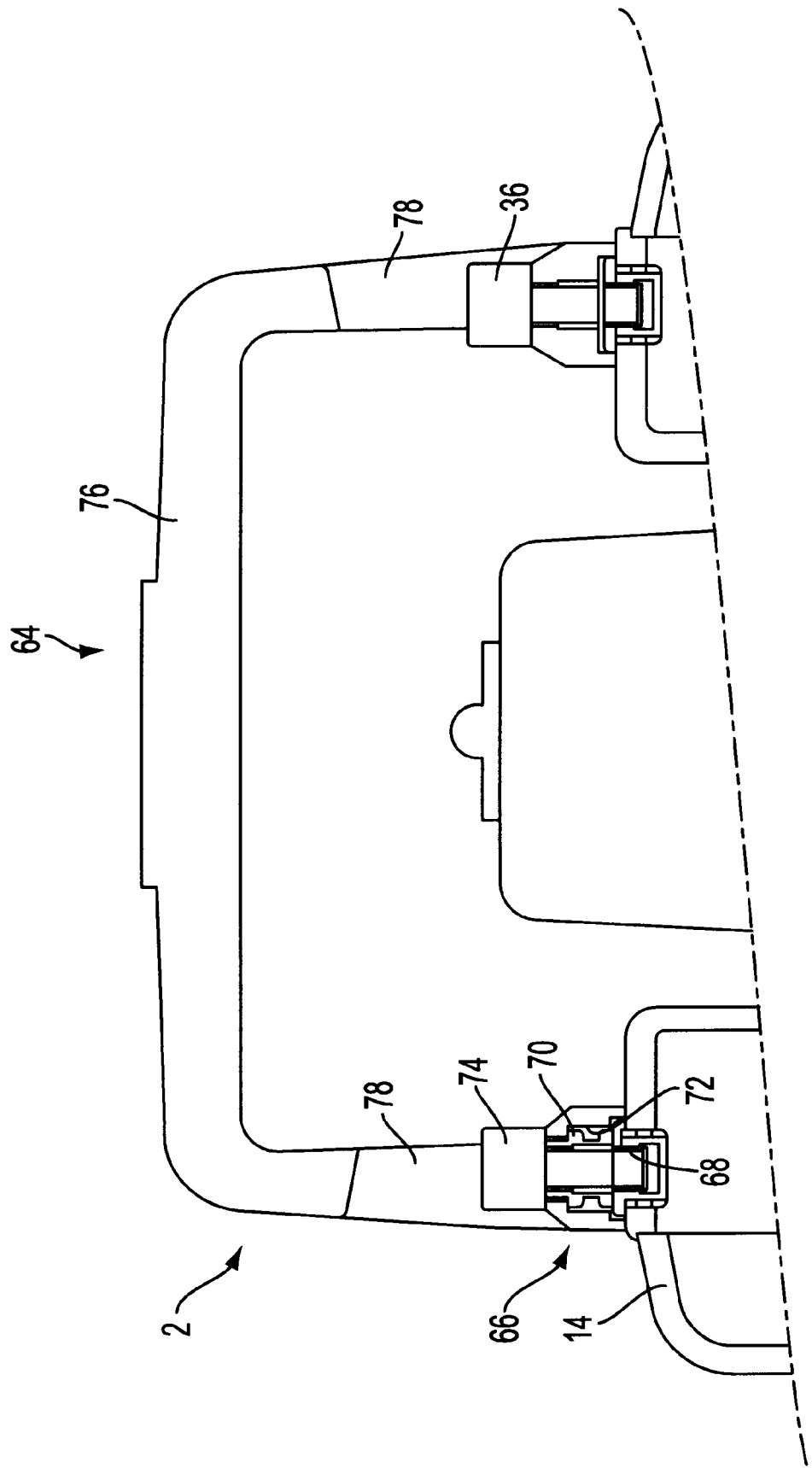
FIG. 5 is a partial sectional front view of the mounting structure of the handgrip of the second embodiment.
Figure 6:
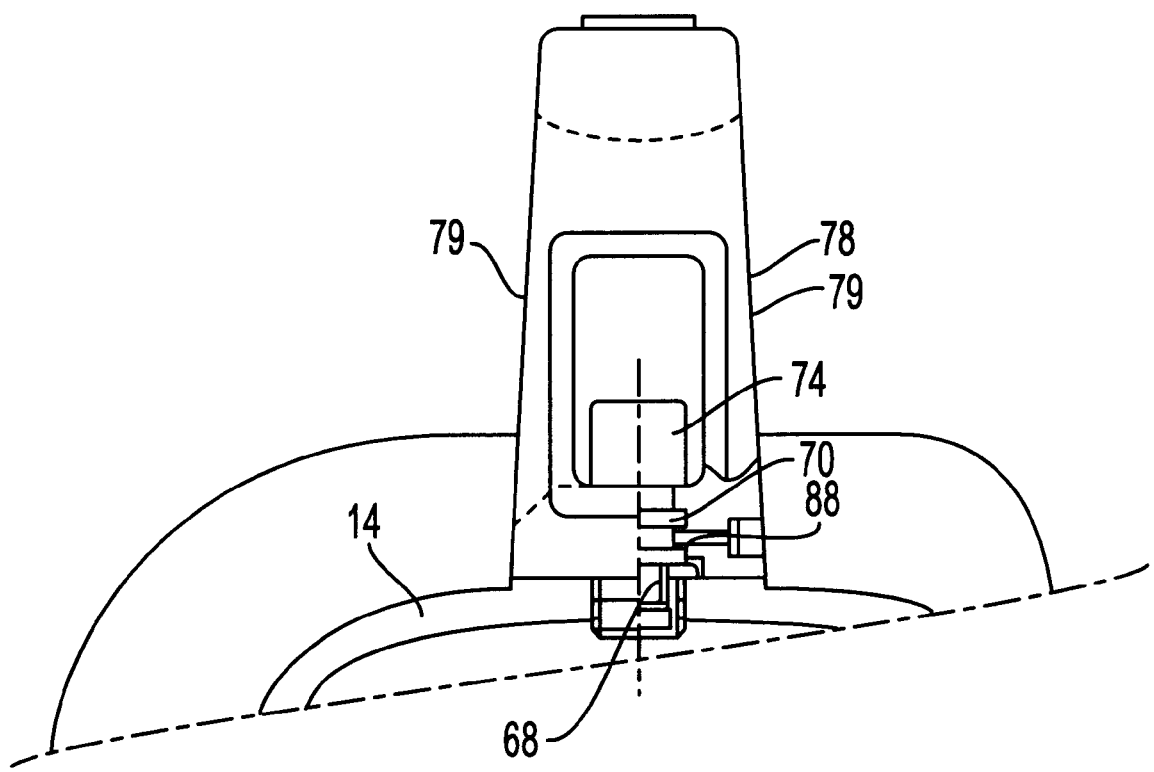
FIG. 6 is a partial sectional side view of the handgrip according to a second embodiment of the invention.

Then, as shown in FIG. 4 with the pin 44 being the center, by rotating the handgrip 24 through a substantial 90 degrees, then moving the handgrip 24 in the direction indicated by C in FIG. 4 so that the pin 44 is taken out of the through hole 56, and the handgrip 24 can be removed from main unit 4 of the surveying device 2.

Conversely, when the handgrip 24 is mounted to the main unit 4 of the surveying device 2, it is advised to perform the aforementioned procedures in reverse. More specifically, as shown in FIG. 4, with the holding portion 25 being made substantially vertical, fitting the pin 44 into the through hole 56 of the holder 46, then rotating the holding portion 25 clockwise by about 90 degrees, and mounting the mounting portion 30 by tightening the male screw 36 in the apex portion of the upright portion 16.

When the handgrip 24 is mounted on the main unit 4 of the surveying device 2, as explained, the clearances S are formed between the flat portion 4404 and the inner periphery of the flattened groove 57, i.e., the clearances S are formed at both sides of the flat portions 4404 of the pin 44. On the other hand, there is almost no clearance between the circular arc portion 4402 and the flat portion 57A.

According to this embodiment, even when the surveying device 2 is carried by the holding portion 25, the pin 44 is positioned in the holder 46 in a rattle-less state due to almost no clearance between the circular arc portion 4402 and the flat portion 57A. As a result, the surveying device 2 can be carried smoothly.

If the ambient temperature changes and the shape and dimensions of the holding portion 25 change with respect to the main unit 4 of the surveying device 2, such dimensional change will be allowed by the clearances S. Consequently, no distortion will emerge in the main unit 4 even if the shape and dimensions of the holding portion 25 change due to the ambient temperature change.

The above explained handgrip mounting structure will prevent drawbacks, such as an error in a surveyed result due to an attitude change of the inclination correction sensor 15.

Furthermore, the location of the inclination correction sensor 15 is not strictly selected because the main unit 4 is free from distortion caused by the shape and dimensional change in the holding portion 25, thus allowing greater degree of freedom in the design.

In this embodiment the open direction (i.e., the open leading portion 58) of the through hole 56 is facing outward from the main unit 4, but it is of course possible to face the open direction inward.

Moreover, it is also possible to go without the open leading portion 58, which means that the through hole 56 is formed as a simple through hole. In this case, the handgrip 24 is mounted or removed from the holder 46 (the main unit 4) by inserting or pulling out the pin 44 itself.

In the above mentioned embodiment, the pin 44 is inserted in the mounting portion 28, and the holder 46 is provided on the upright portion 14 of the main unit 4 of the surveying device 2. As an alternative, it is possible to install the holder 46 on which the through hole 56 is mounted on the mounting portion 28, and the pin 44 is arranged to be installed on the upright portion 14.

Furthermore, it is possible to provide a hook in place of the pin 44 on the mounting portion 28, and the hook is arranged to engage a holder provided on the main unit 4 of the surveying device 2. Even in this case, if a clearance S is provided in a joining area of the hook and the holder, the aforementioned effects will also be obtained. More specifically, an inner periphery of the hook is considered a through hole, and the holder (or a part of the holder) is considered a mating counterpart which is formed in an axial shape to engage the hook.

The second embodiment of the present invention will be explained while referring to FIGS. 5 through 8.

The mounting structure of the handgrip 64 in the second embodiment is different from that of the first embodiment with respect to the structure of the mounting portion 66. Except for this point, the structure is the same as the first embodiment. Members that have already appeared in FIGS. 1 through 4 are assigned the same numbers in FIGS. 5 through 8, and no explanations will be made for those members.

The mounting portion 66, like in the first embodiment, is provided on one of a pair of leg portions 78 which are downwardly extended from a holding portion 76 of the handgrip 64. The mounting portion 66 is detachably mounted on the upright portion 14 through a female screw 68, a spacer 70 (a spacer related to the present invention), and a through hole 72 (a through hole related to the present invention).

Figure 7:
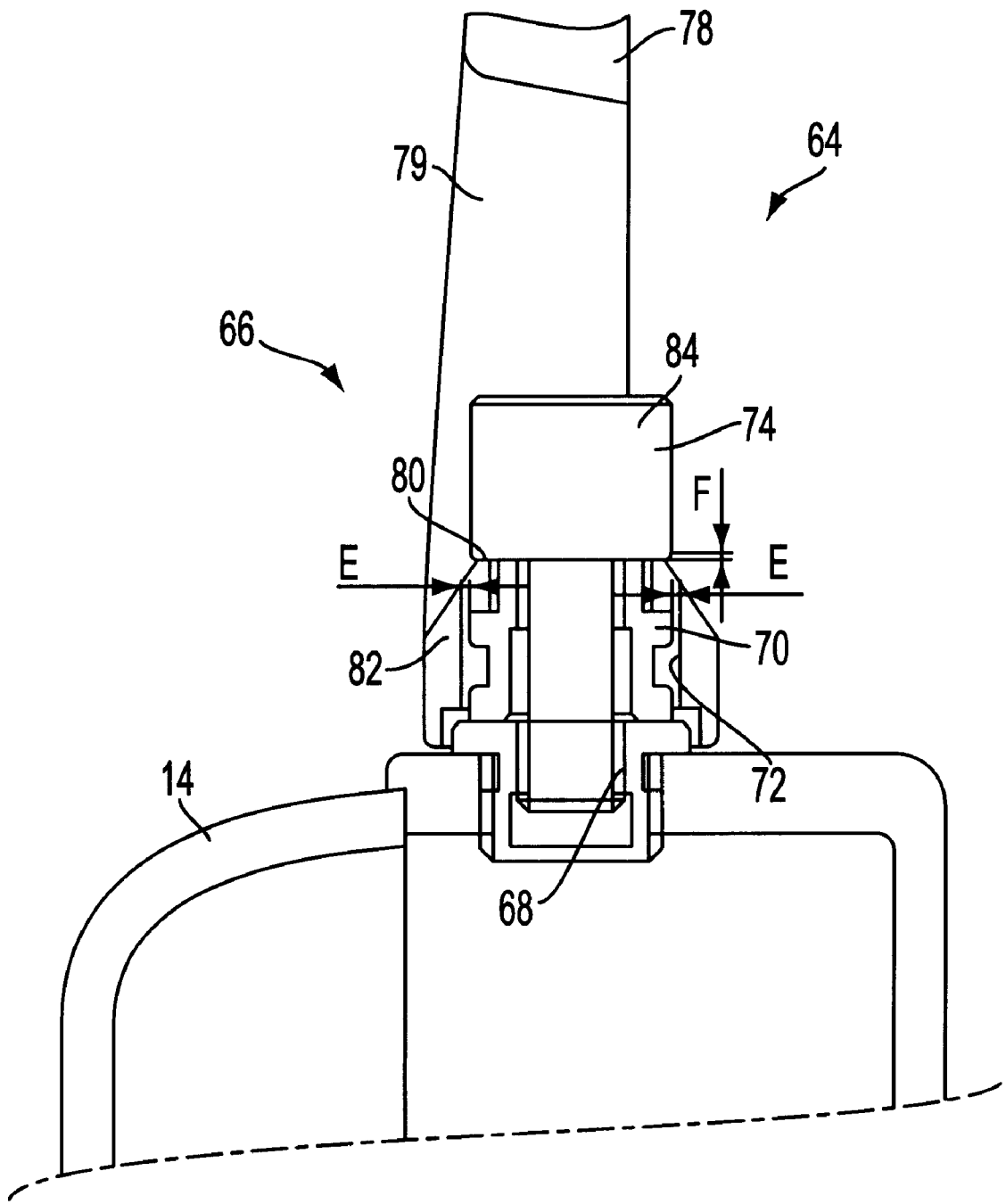
FIG. 7 is a partial sectional front view of a main part of the second embodiment.
Figure 8:
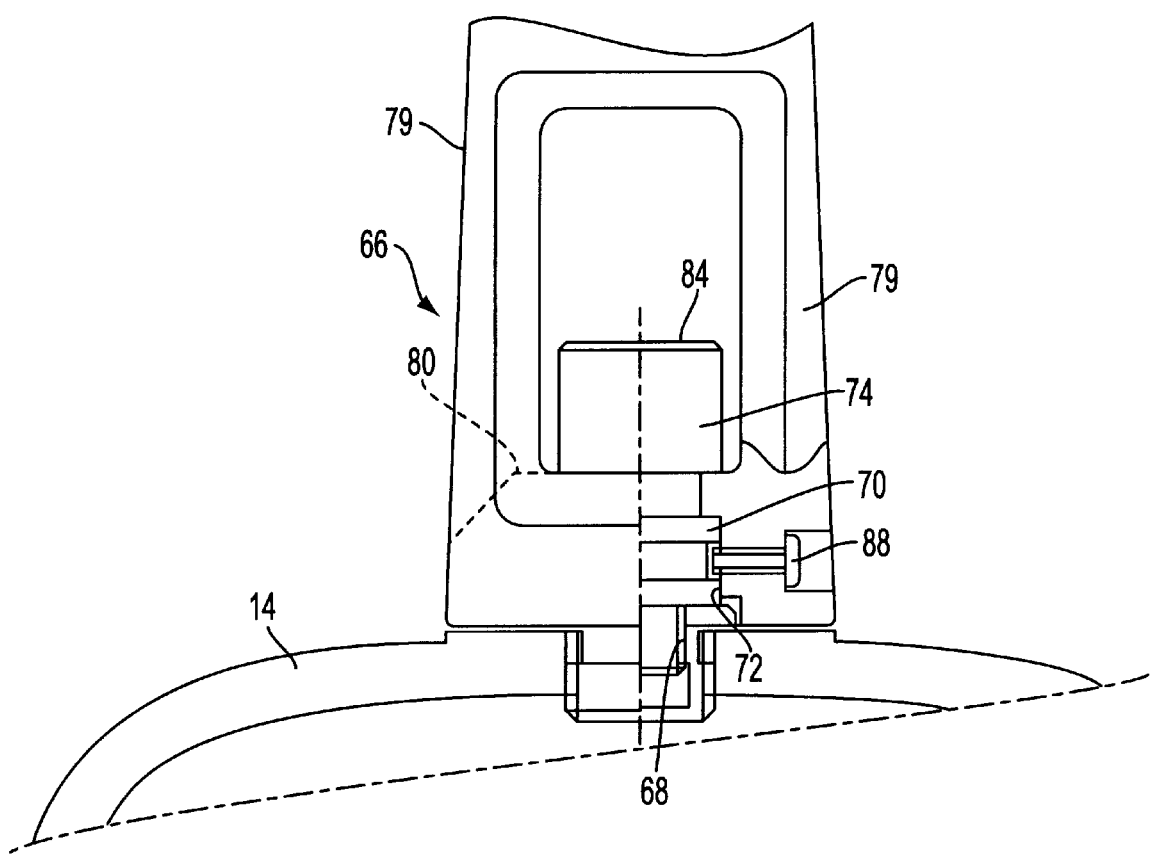
FIG. 8 is a partial sectional side view of a main part of the second embodiment.

As shown in FIGS. 7 and 8, the female screw 68 is formed in the apex portion of upright portion 14 of main unit 4 of surveying device 2, and extends substantially normal (perpendicular) to the ground when the surveying device 2 is in use.

A bifurcated portion 79 is provided on the end of the leg 78 of the holding portion 76, and on the forefront of fork portion 79 there is provided a boss portion 82 having a flat surface 80 which is substantially parallel to the holding portion 76. On the boss portion 82, a through hole 72, which extends in the same direction as the leg portion 78, is formed.

In addition, the through hole 72, like the flattened groove 57, is formed in a flattened form, i.e., when viewed in a horizontal cross-section, a cross-section of the through hole 72 is not a circle, but a flattened shape, in the direction of the holding portion 76 having circular portions and flat portions. When the handgrip 64 is mounted on the upright portion 14, the female screw 68 is coaxially arranged with the through hole 72. A clearance E is formed between an inner surface of the through hole 72 and an outer surface of the spacer 70 which is made cylindrical. As shown in FIG. 7, due to the coaxial arrangement of the through hole 72, the female screw 68 and the spacer 70, the two clearances E are observed in the right and left direction of the surveying device 2. On the other hand, due to the flattened shape of the through hole 72 in the direction of the holding portion 76, the mounting portion 66 is firmly mounted on the upright portion 14 in the front-to-back direction of the surveying device 2. The axial length of the spacer 70 is arranged so that the top end of the spacer 70 slightly protrudes from the flat surface 80 of the boss portion 82. Furthermore, a screw 88 is screw-engaged in a groove formed on the circumferential surface of the spacer 70 so that the spacer 70 is prevented from coming off from the through hole 72 when the handgrip 64 is removed from the main unit 4.

To engage the female screw 68 formed on the upright portion 14, a male screw 74 is positioned in the through hole 72, and the male screw 74 is fixed to a head portion 84 so that the male screw 74 is rotated by an operator's fingers through the head portion 84.

According to this arrangement, the spacer 70 is fixed with respect to the upright portion 14 while a clearance F is formed between a lower surface of the head portion 84 and the flat surface 80 of the boss portion 82, thus the handgrip 64 is mounted to the main unit 4 of the surveying device 2. In this embodiment, the male screw 74 and the spacer 70 constitute a shaft member. When the handgrip 64 is removed from the main unit 4, both male screws 36 and 74 are loosened.

According to the second embodiment, when the surveying device 2 is carried with the holding portion 76, the boss portion 82 is connected to the upright portion 14 by the male screw 74 in an almost rattle-less condition in the vertical direction, so that the surveying device 2 can be carried smoothly.

If the dimensions of the holding portion 76 change due to the ambient temperature change, such dimensional change is allowed in the clearance E, so that no distortion occurs in the main unit 4 due to the dimension-change in the holding portion 76. Furthermore, a location of the inclination correction sensor 15 is not strictly selected because the main unit 4 is free from distortion caused by the shape and dimensional change in the holding portion 25, thus allowing a greater degree of freedom in the design work.

As an alternative, it is possible to provide a male screw at the apex of the upright portion 14. The male screw is inserted into the spacer 70, and then a nut is screw-engaged to the top of the spacer 70. According to this arrangement, the aforementioned results will be obtained.

The first and second embodiments of the present invention are directed to a series of explanations in which the handgrip is mounted on the surveying device, but the present invention can be applied to any kind of electric devices.

According to the embodiments of the present invention, even when the dimension of the holding portion changes with respect to the main body of the electric device due to the change of the ambient temperature, the dimensional change is allowed in the place where the holding portion and the main body of the electric device is connected. Consequently, no distortion occurs on the main body due to the dimensional change of the handgrip.

Furthermore, if the electric device is a surveying device, the measuring precision of the surveying device will be enhanced, and at the same time, the degree of freedom in design work is increased.

I claim:

1. A handgrip mounting structure in an electric device comprising a main body and a handgrip to be mounted on said main body, said handgrip including a holding portion, to be held by an operator, having a predetermined length, and mounting portions to be mounted on said main body, said mounting portions being provided at each end of said holding portion, and said handgrip having a thermal expansion ratio in a longitudinal direction of the holding portion different from a thermal expansion ratio of said main body, wherein at least one of said mounting portions of said holding portion is mounted to said main body so that a shaft member provided on one of said mounting portions and said main body is inserted into a through hole formed on the other of said main body and one of said mounting portions; and wherein a clearance in the longitudinal direction of the holding portion is provided between said through hole and said shaft member so that a dimensional change due to thermal expansion between said holding portion and said main body is absorbed by relative movement between said holding portion and said main body allowed by said clearance.

2. The handgrip mounting structure in an electric device according to claim 1, wherein a size of said clearance is determined to allow said relative movement between said holding portion and said main body in a direction to absorb said dimensional change due to thermal expansion between said holding portion and said main body.

3. The handgrip mounting structure in an electric device according to claim 2, wherein said relative movement between said holding portion and said main body is allowed in a direction parallel to an extending direction of said holding portion of said handgrip.

4. The handgrip mounting structure in an electric device according to claim 1, wherein a cross-section of said through hole is oval with a semi-circular end and flat surfaces extending from said semi-circular end, said flat surfaces are substantially parallel with said holding portion.

5. The handgrip mounting structure in an electric device according to claim 1, wherein a cross-section of said shaft member comprises a circular peripheral area and a flat peripheral area, said circular peripheral area includes a pair of opposing circular peripheries, and said flat periphery area includes a pair of opposing flat peripheries, and wherein a distance between said circular periphery area is narrower than a distance between said flat periphery area so that said circular periphery area maintains contact with said inner surface of said through hole without substantial clearance, such that said circular periphery area can rotate with respect to said inner surface of said through hole when said handgrip is mounted to said main body of said electric device.

6. The handgrip mounting structure in an electric device according to claim 5, wherein said handgrip is rotatable about said shaft member so that the other of said mounting portions spaced from said main body, wherein at a location on said mounting portion or said main body where said through hole is formed, an opening connected to said through hole is formed, so that said opening faces said narrower distance between said circular periphery areas when said handgrip is rotatable by a predetermined rotating angle, and wherein said opening has a vertical width to allow said narrower distance between said circular periphery areas to pass therethrough while said flat peripheries face inner surfaces of said opening, so that said handgrip can be removed from said main body.

7. The handgrip mounting structure in an electric device according to claim 6, wherein said mounting portions are provided on an end of each of leg portions provided on respective ends of said holding portion, said leg portions extending normal to said holding portion, and wherein said shaft member extends in a direction normal to said leg portions.

8. The handgrip mounting structure in an electric device according to claim 6, wherein said opening is formed on said main body of said electric device.

9. The handgrip mounting structure in an electric device according to claim 8, wherein said opening and said through hole are formed on a holder which is fixedly provided on said main body, and said holder is formed in a predetermined shape to engage said mounting portion of said handgrip.

10. The handgrip mounting structure in an electric device according to claim 9, wherein said mounting portion is formed in a bifurcated shape, between which said holder is positioned when said mounting portion is connected to said main body, and wherein said shaft member is fixed at a part of said bifurcated shape.

11. The handgrip mounting structure in an electric device according to claim 1, wherein at least one of said mounting portions of said holding portion is mounted to said main body so that a spacer is inserted in said through hole formed on said one of said mounting portions and said main body, and said spacer is fixed to one of said main body and said mounting portions by a screw having a head portion;

wherein a lower surface of said head portion of said screw comes into contact with an end surface of said spacer, and said lower surface of said head portion of said screw and an upper end of said through hole are spaced by a predetermined distance;

wherein said clearance is formed between said inner surface of said through hole and an outer surface of said spacer; and wherein said shaft member comprises said spacer and said screw.

12. The handgrip mounting structure in an electric device according to claim 11, wherein said mounting portion includes a boss portion in which said through hole is formed.

13. The handgrip mounting structure in an electric device according to claim 12, wherein said boss portion has prevention means to prevent said spacer coaxially inserted in said through hole from being removed from said through hole.

14. The handgrip mounting structure in an electric device according to claim 13, wherein said mounting portions are provided on an end of each of legs portions provided on a respective end of said holding portion, said leg portions extending normal to said holding portion, and wherein said shaft member extending in a direction parallel to said leg portions.

15. The handgrip mounting structure in an electric device according to claim 14, wherein the other of said mounting portion of said holding portions is detachably mounted to said main body by a screw.

16. The handgrip mounting structure in an electric device according to claim 11, wherein said mounting portions are provided on an end of each of legs portions provided on a respective end of said holding portion, said leg portions extending normal to said holding portion, and wherein said shaft member extends in a direction parallel to said leg portions.

17. The handgrip mounting structure in an electric device according to claim 16, wherein the other of said mounting portions of said holding portion is detachably mounted to said main body by a screw.

18. The handgrip mounting structure in an electric device according to claim 12, wherein said mounting portions are provided on an end of each of legs portions provided on a respective end of said holding portion, said leg portions extending normal to said holding portion, and wherein said shaft member extends in a direction parallel to said leg portions.

19. The handgrip mounting structure in an electric device according to claim 18, wherein the other of said mounting portion of said holding portions is detachably mounted to said main body by a screw.

20. The handgrip mounting structure in an electric device according to claim 1, wherein said mounting portions are provided on an end of each leg portion provided on a respective end of said holding portion, said leg portions extending normal to said holding portion, and wherein said shaft member extends in a direction parallel to said leg portions.

21. The handgrip mounting structure in an electric device according to claim 20, wherein another of said mounting portion of said holding portion is detachably mounted to said main body by a screw.

22. The handgrip mounting structure in an electric device according to claim 1, wherein said electric device is a surveying device.

23. The handgrip mounting structure in an electric device according to claim 22, wherein said holding portion horizontally extends over said main body of said surveying device in use.

24. The handgrip mounting structure in an electric device according to claim 23, wherein said main body of said surveying device is equipped with a inclination correction sensor.

25. A handgrip mounting structure in an electric device, comprising:

a handgrip made of a material having a predetermined thermal expansion ratio;

a main body on which said handgrip is detachably mounted, said main body being made of a material having a thermal expansion ratio which is different from said thermal expansion ratio of said handgrip;

means for detachably connecting said main body and said handgrip without relative movement between said handgrip and said main body in a direction of a gravitational force;

means for preventing a thermal expansion force in said handgrip, due to an ambient temperature change, from being applied to said main body, said preventing means being provided in a part of said detachable connecting means.

26. A handgrip mounting structure for use with an electric device, comprising:

a handgrip made of a material having a predetermined thermal expansion ratio;

a body to which said handgrip is detachably mountable, said body being made of a material having a thermal expansion ratio which is different from the thermal expansion ratio of said handgrip;

a mechanism that detachably connects said body and said handgrip, said body and said handgrip being connected by said detachable connecting mechanism so that no relative movement between said handgrip and said body occurs in a direction of gravitational force; and a device that prevents a thermal expansion force in said handgrip, due to an ambient temperature change, from being transmitted to said body, said preventing device comprising a portion of said connecting mechanism.

* * * * *